(12) United States Patent
Hatate et al.

(10) Patent No.: US 7,755,064 B2
(45) Date of Patent: Jul. 13, 2010

(54) RESIST PATTERN PROCESSING EQUIPMENT AND RESIST PATTERN PROCESSING METHOD

(75) Inventors: Hitoshi Hatate, Tokyo (JP); Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 458 days.

(21) Appl. No.: 11/714,737

(22) Filed: Mar. 7, 2007

(65) Prior Publication Data
US 2008/0220366 A1    Sep. 11, 2008

(51) Int. Cl.
*B08B 7/00* (2006.01)
*H01L 21/302* (2006.01)
(52) U.S. Cl. ............... 250/492.1; 250/455.11; 250/492.2; 438/759; 438/771; 438/795; 438/906; 422/186.3; 134/1.3; 430/329
(58) Field of Classification Search ............ 250/455.11, 250/492.1, 492.2; 422/186.3; 438/759, 906, 438/795, 771; 134/1.3; 430/329
See application file for complete search history.

(56) References Cited

U.S. PATENT DOCUMENTS

| 5,176,782 A * | 1/1993 | Ishibashi et al. ....... 156/345.33 |
| 5,547,642 A | 8/1996 | Seiwa et al. |
| 2002/0112739 A1 * | 8/2002 | Roth-Folsch et al. ......... 134/1.3 |

FOREIGN PATENT DOCUMENTS

| JP | A-06-231735 | 8/1994 |
| JP | A-07-253677 | 10/1995 |
| JP | A-2001-237212 | 8/2001 |
| JP | A-2004-024957 | 1/2004 |

* cited by examiner

*Primary Examiner*—Jack I Berman
(74) *Attorney, Agent, or Firm*—Oliff & Berridge, PLC

(57) ABSTRACT

A resist pattern processing apparatus comprises a stage for mounting a substrate having a patterned photoresist arranged on a surface thereof, a UV-emitting part for emitting UV rays to the stage, and an annular member for surrounding the whole periphery of the substrate. This allows the annular member to restrain ozone supplied near a mounting surface for the substrate on the stage from diffusing to the periphery of the stage, whereby the ozone concentration becomes even in the surface of the substrate mounted on the stage.

11 Claims, 5 Drawing Sheets

*Fig.5*

|  | EXAMPLE 1 | COMPARATIVE EXAMPLE 1 |
|---|---|---|
| MAX | 52.1nm | 53.8nm |
| MIN | 48.5nm | 43.5nm |
| MAX−MIN | 3.6nm | 10.3nm |
| AVERAGE | 49.9nm | 49.2nm |
| 3σ | 3.0nm | 8.4nm |

RESIST PATTERN PROCESSING EQUIPMENT AND RESIST PATTERN PROCESSING METHOD

BACKGROUND OF THE INVENTION

1. Field of the Invention

The present invention relates to a resist pattern processing equipment and a resist pattern processing method.

2. Related Background Art

A resist removing apparatus (ashing apparatus) has conventionally been known (see, for example, Japanese Patent Application Laid-Open No. 6-231735), which comprises a stage for mounting a substrate having a photoresist arranged on a surface and a UV lamp for emitting UV rays to the stage, and supplies ozone ($O_3$) generated when the UV rays emitted from the UV lamp react with oxygen ($O_2$) in the atmosphere to the vicinity of the substrate mounting surface in the stage.

SUMMARY OF THE INVENTION

For superfine processing of substrates, it has recently been demanded to regulate the linewidth of photoresist with a high precision in the order of nanometers. For fulfilling this demand, a technique for slimming the linewidth of a photoresist patterned on a substrate (resist pattern) by using the above-mentioned resist removing apparatus and the like has been proposed.

In the conventional resist removing apparatus such as the one mentioned above, however, nothing but the substrate is mounted on the stage, so that the distance between the UV lamp and the stage in the surroundings of the substrate is much greater than the distance between the UV lamp and the substrate. Therefore, in the space between the UV lamp and stage existing in the surroundings of the substrate, ozone supplied near the surface of the substrate is easier to disperse than in the space between the UV lamp and substrate, whereby the ozone concentration is more likely to decrease. As a result, the ozone concentration tends to become uneven in the surface of the substrate mounted on the stage in the conventional resist removing apparatus. Hence, when the conventional resist removing apparatus is used for slimming the linewidth of the resist pattern on the substrate surface, the linewidth of the resist pattern may vary depending on the ozone concentration distribution in the substrate surface, whereby a photoresist having a resist pattern with a uniform linewidth cannot be obtained.

As a resist removing apparatus, one using an oxygen plasma produced by a high-frequency wave such as a microwave at a frequency of about 2.45 GHz or a radiofrequency (RF) wave at a frequency of about 13.65 kHz has also been known. However, the resist removing apparatus using an oxygen plasma has been problematic in that it is unsuitable for regulating the linewidth of resist patterns on the order of nanometers, since a large amount of photoresist is removed at the time of plasma ignition. Though a shutter device may be added to the resist removing apparatus in order to avoid this problem, this makes the resist removing apparatus complicated and bulky, thus failing to regulate the linewidth of resist patterns easily at low cost.

It is therefore an object of the present invention to provide a resist pattern processing apparatus and resist pattern processing method which can achieve uniform and high-precision slimming of the linewidth of resist patterns arranged on a substrate in an inexpensive and easy manner.

The resist pattern processing apparatus in accordance with the present invention comprises a stage for mounting a substrate having a patterned photoresist arranged on a surface thereof; a UV-emitting device for emitting a UV ray to the stage; and an annular member for surrounding the whole periphery of the substrate.

The resist pattern processing apparatus in accordance with the present invention includes the annular member for surrounding the whole periphery of the substrate mounted on the stage. Therefore, the difference between the distance between the UV-emitting device and the annular member in the surroundings of the substrate and the distance between the UV-emitting device and the substrate becomes smaller than in the case where there is no annular member as in the conventional cases. As a result, the annular member restrains ozone supplied near the surface of the substrate from diff-using to the surroundings of the substrate, which makes it easier for the ozone concentration in the surface of the substrate mounted on the stage to become even, whereby uniform and high-precision slimming of resist patterns arranged on the substrate can be achieved in an inexpensive and easy manner.

Preferably, the annular member has a thickness which is at least ½ that of the substrate. This can further restrain ozone from diffusing to the periphery of the stage.

Preferably, the thickness of the annular member is substantially the same as that of the substrate. This can further restrain ozone from diffusing to the periphery of the stage.

Preferably, the shortest distance between the outer and inner peripheral faces of the annular member is at least 20 mm. This can further restrain ozone from diffusing to the periphery of the stage as well.

Preferably, the UV-emitting device comprises a housing having an opening facing the stage, a UV-transmitting member arranged so as to close the opening, and a UV lamp arranged in a space formed by the housing and the UV-transmitting member, whereas a gap between the inner peripheral face of the annular member and a side face of the substrate is smaller than the smaller of the thickness of the substrate and the distance between the UV-transmitting member and the substrate. In this case, even when there is a gap between the substrate and the annular member, ozone does not stay in the gap more than necessary, whereby the ozone concentration in the surface of the substrate mounted on the stage can be made evener.

On the other hand, the resist pattern processing method in accordance with the present invention comprises a mounting step of mounting a substrate having a patterned photoresist arranged on a surface thereof onto a stage such that an annular member is positioned at the whole periphery of the substrate, and an irradiation step of causing a UV-emitting device to emit a UV ray to the surface of the substrate mounted on the stage.

The resist pattern processing method in accordance with the present invention mounts the substrate on the stage such that the annular member is positioned at the whole periphery of the substrate. Therefore, the difference between the distance between the UV-emitting device and the annular member in the surroundings of the substrate and the distance between the UV-emitting device and the substrate becomes smaller than in the case where there is no annular member as in the conventional cases. As a result, the annular member restrains ozone supplied near the surface of the substrate from diffusing to the surroundings of the substrate, which makes it easier for the ozone concentration in the surface of the substrate mounted on the stage to become even, whereby uniform and high-precision slimming of resist patterns arranged on the substrate can be achieved in an inexpensive and easy manner.

Preferably, the annular member has a thickness which is at least ½ that of the substrate. This can further restrain ozone from diffusing to the periphery of the stage.

Preferably, the thickness of the annular member is substantially the same as that of the substrate. This can further restrain ozone from diffusing to the periphery of the stage.

Preferably, the shortest distance between the outer and inner peripheral faces of the annular member is at least 20 mm. This can further restrain ozone from diff-using to the periphery of the stage as well.

Preferably, the UV-emitting device comprises a housing having an opening facing the stage, a UV-transmitting member arranged so as to close the opening, and a UV lamp arranged in a space formed by the housing and the UV-transmitting member, whereas a gap between the inner peripheral face of the annular member and a side face of the substrate is smaller than the smaller of the thickness of the substrate and the distance between the UV-transmitting member and the substrate. In this case, even when there is a gap between the substrate and the annular member, ozone does not stay in the gap more than necessary, whereby the ozone concentration in the surface of the substrate mounted on the stage can be made evener.

Preferably, the annular member is separate from the stage, whereas the mounting step mounts the substrate onto the stage after mounting the annular member onto the stage.

Preferably, the annular member is separate from the stage, whereas the mounting step mounts the annular member onto the stage after mounting the substrate onto the stage.

The present invention can provide a resist pattern processing apparatus and resist pattern processing method which can achieve uniform and high-precision slimming of the linewidth of resist patterns arranged on a substrate in an inexpensive and easy manner.

The present invention will be more fully understood from the detailed description given here in below and the accompanying drawings which are given by way of illustration only, and thus are not to be considered as limiting the present invention.

BRIEF DESCRIPTION OF THE DRAWINGS

FIG. 5 is a chart showing results of measurement of the linewidth in resist patterns in Example 1 and Comparative Example 1.

DESCRIPTION OF THE PREFERRED EMBODIMENTS

In the following, embodiments of the present invention will be explained with reference to the drawings. The same constituents will be referred to with the same numerals while omitting their overlapping explanations.

Figure 1:
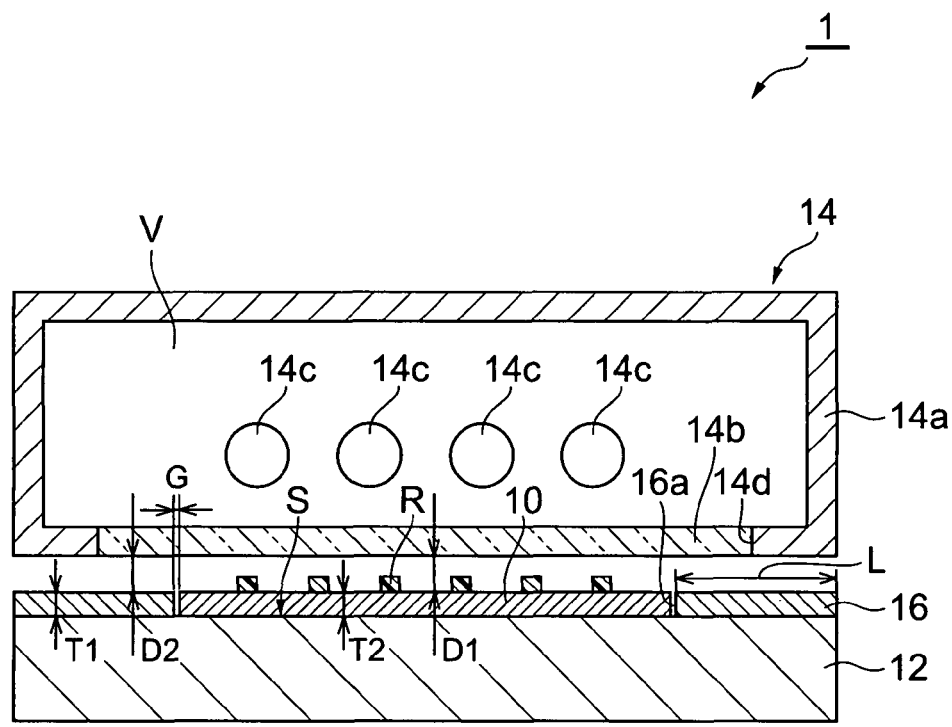
FIG. 1 is a vertical sectional view showing the resist pattern processing apparatus in accordance with an embodiment.
Figure 2:
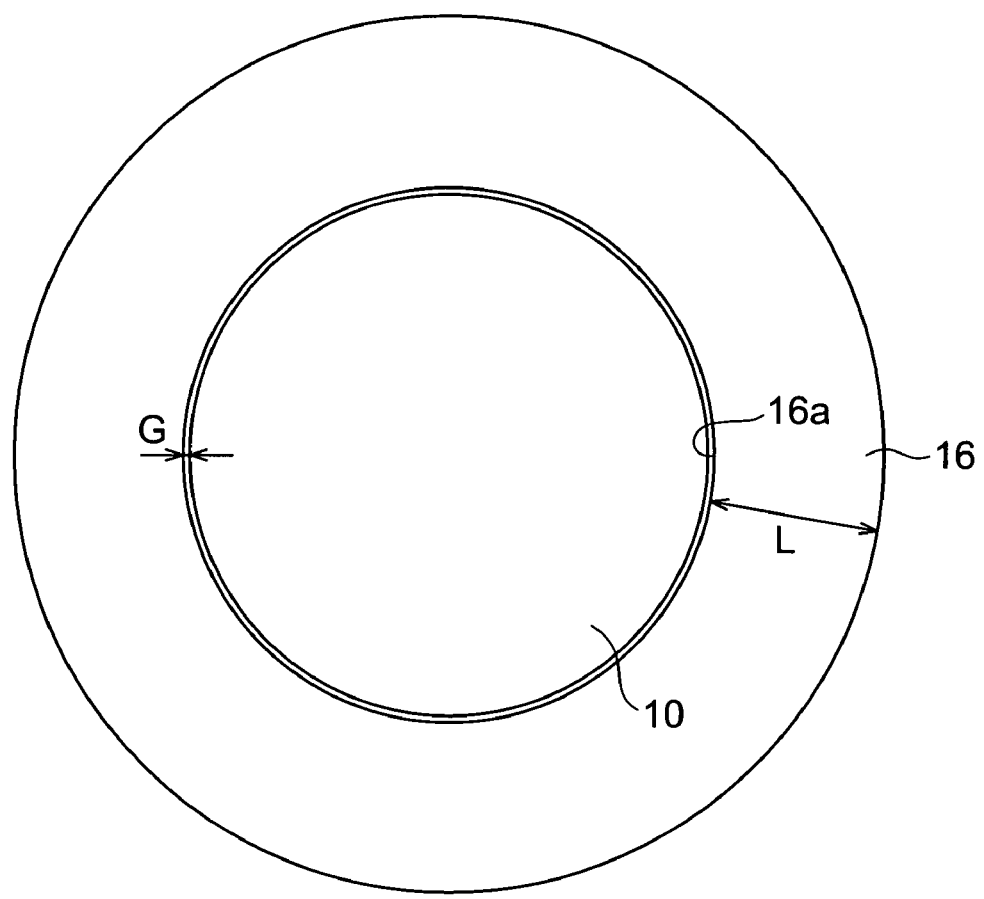
FIG. 2 is a top plan view showing a stage included in the resist pattern processing apparatus in accordance with the above-mentioned embodiment.

With reference to FIG. 1 and FIG. 2, the resist pattern processing apparatus 1 in accordance with an embodiment will be explained. FIG. 1 is a vertical sectional view showing the resist pattern processing apparatus in accordance with this embodiment. FIG. 2 is a top plan view showing a stage included in the resist pattern processing apparatus in accordance with the embodiment.

The resist pattern processing apparatus 1 is an apparatus for slimming the linewidth of resist patterns (patterned photoresist R) arranged on a surface of a substrate 10 by ozone ($O_3$). The resist pattern processing apparatus 1 comprises a stage 12, a UV-emitting part 14, and an annular member 16. The substrate 10 has a substantially circular form. As the substrate 10, any of those having various sizes such as diameters of 2, 3, 4, 6, 8, and 12 inches can be used. The photoresist R may be either of positive or negative type, whereby various resists such as those for KrF excimer laser, g-line, i-line, ArF excimer laser, EUV (extreme ultraviolet), and electron beams can be used.

The stage 12 is used for mounting the substrate 10 and has a mounting surface S. The annular member 16 is also mounted on the mounting surface S of the stage 12 in this embodiment.

The UV-emitting part 14 comprises a housing 14a, a glass plate 14b made of silica, and a plurality of UV lamps 14c. The housing 14a has an opening 14d facing the stage 12, whereas the glass plate 14b is provided so as to close the opening 14d. The UV lamps 14c are arranged within a space V formed by the housing 14a and the glass plate 14b. For cooling the heat generated when the UV lamps 14c emit UV rays, a cooling gas such as $N_2$ or Ar, for example, is circulated in the space V. For irradiating the whole area of the surface of the substrate 10 with UV rays, the glass plate 14b of the UV-emitting part 14 is larger than the substrate 10. The distance D1 between the lower face of the glass plate 14b of the UV-emitting part 14 and the surface of the substrate 10 mounted on the mounting surface S of the stage 12 is preferably set to about 1 mm to 5 mm, more preferably about 2 mm.

As shown in FIG. 1 and FIG. 2, the annular member 16 has an opening 16a in a form corresponding to the substrate 10 (a substantially circular form in this embodiment) in order to surround the periphery of the substrate 10. The annular member 16 may be formed from any of materials by which the annular member 16 is made so as not to transmit ozone therethrough, e.g., metal materials such as stainless, iron, Cu, Ti, Mo, Cr, Al, and Si.

The thickness T1 of the annular member 16 is preferably at least ½ of the thickness T2 of the substrate 10, more preferably substantially the same as the thickness T2 of the substrate 10. When the thickness T1 of the annular member 16 is smaller than ½ of the thickness T2 of the substrate 10, the effect of the annular member 16 restraining ozone from diffusing to the periphery of the stage 12 tends to become smaller. When the thickness T1 of the annular member 16 is greater than the thickness T2 of the substrate 10, the diffusion of ozone to the periphery of the stage 12 tends to be suppressed more than necessary, whereby the linewidth of resist patterns becomes too slim in peripheral parts of the substrate 10.

The width L of the annular member 16 (the shortest distance between the outer and inner peripheral faces of the annular member 16) is preferably at least 20 mm. When the width L of the annular member 16 is smaller than 20 mm, the effect of the annular member 16 restraining ozone from diffusing to the periphery of the stage 12 tends to become smaller. In this case, the linewidth of resist patterns is prone to be too thick in outer peripheral parts of the substrate 10, whereby the linewidth of resist patterns arranged on the substrate 10 may be easier to become uneven.

A method of slimming the linewidth of a resist pattern (patterned photoresist R) arranged on the substrate 10 by using the resist pattern processing apparatus 1 having the structure mentioned above will now be explained.

First, the annular member 16 is mounted on the mounting surface S of the stage 12. Then, within the opening 16a of the annular member 16 on the mounting surface S of the stage 12, the substrate 10 having the patterned photoresist R on a surface thereof is mounted such that the surface having the photoresist R arranged thereon faces up. As a consequence, the whole periphery of the substrate 10 is surrounded by the annular member 16. Here, the distance G (see FIG. 1 and FIG. 2) between the side face of the substrate 10 and the inner peripheral face of the opening 16a of the annular member 16 is preferably smaller than the smaller of the thickness T2 of the substrate 10 and the distance D1 between the lower face of the glass plate 14b and the surface of the substrate 10, and can specifically be set to 0 mm (the state where the side face of the substrate 10 and the inner peripheral face of the opening 16a of the annular member 16 are in contact with each other) to about 2 mm. The substrate 10 may be mounted on the mounting surface S of the stage 12 at first, and then the annular member 16 may be mounted on the mounting surface S of the stage 12 such that the substrate 10 is positioned within the opening 16a of the annular member 16.

Subsequently, the UV-emitting part 14 is brought closer to the stage 12 such that the distance D1 between the lower face of the glass plate 14b and the surface of the substrate 10 becomes a predetermined value. After securing an air atmosphere between the glass plate 14b and the substrate 10, the UV lamps 14c are caused to emit UV rays to the stage 12 (substrate 10). As a consequence, ozone generated when oxygen in the air reacts with the UV rays is supplied to the photoresist R patterned on the substrate 10.

When ozone is supplied to the photoresist R, organic matters constituting the photoresist R react with ozone, thereby decomposing into $CO$, $CO_2$, $H_2O$, and the like. Consequently, the photoresist R gradually decomposes from the surface, thus the linewidth of the resist pattern is slimed.

As in the foregoing, the resist pattern processing apparatus 1 in this embodiment includes the annular member 16 for surrounding the whole periphery of the substrate 10 mounted on the stage 12. Therefore, the difference between the distance D2 between the lower face of the glass plate 14b of the UV-emitting part 14 and the surroundings of the substrate 10 and the distance D1 between the lower face of the glass plate 14b of the UV-emitting part 14 and the annular member 16 in the surface of the substrate 10 mounted on the mounting surface S of the stage 12 becomes smaller than in the case where there is no annular member 16 as in the conventional cases. As a result, the annular member 16 restrains ozone supplied near the surface of the substrate 10 from diffusing to the surroundings of the substrate 10, which makes it easier for the ozone concentration in the surface of the substrate 10 mounted on the stage 12 to become even, whereby uniform and high-precision slimming of the resist pattern (patterned photoresist R) arranged on the substrate 10 can be achieved in an inexpensive and easy manner.

Though a preferred embodiment of the present invention is explained in detail in the foregoing, the present invention is not limited to the above-mentioned embodiment. For example, the resist pattern processing apparatus 1 in accordance with the present invention is employable for any substrate having a patterned photoresist R arranged on a surface thereof, whereby its application to various electronic components such as thin-film magnetic heads and semiconductors can be considered.

Though substantially circular in this embodiment, the substrate 10 may have a quadrangular form such as square or rectangular form. In the latter case, for improving the effect of restraining ozone from diffusing to the periphery of the stage 12, it will be preferred if the opening 16a of the annular member 16 also has a quadrangular form corresponding to the substrate 10.

Figure 3:
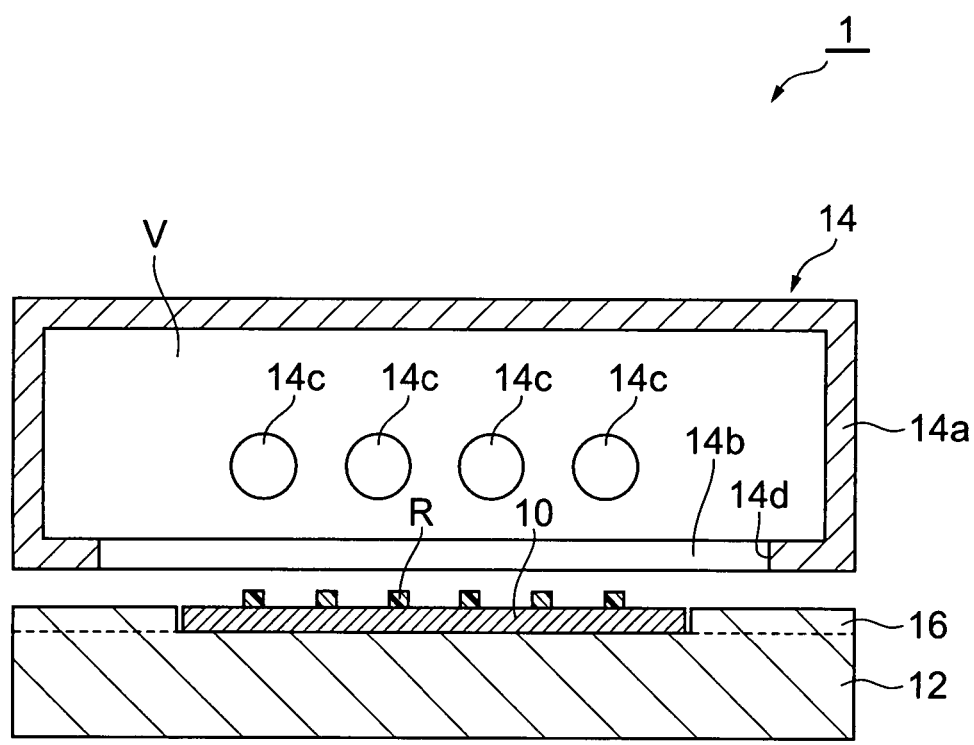
FIG. 3 is a vertical sectional view showing the resist pattern processing apparatus in accordance with another embodiment.

The stage 12 and the annular member 16 are separate from each other in this embodiment, but may be integrated as shown in FIG. 3.

Figure 4:
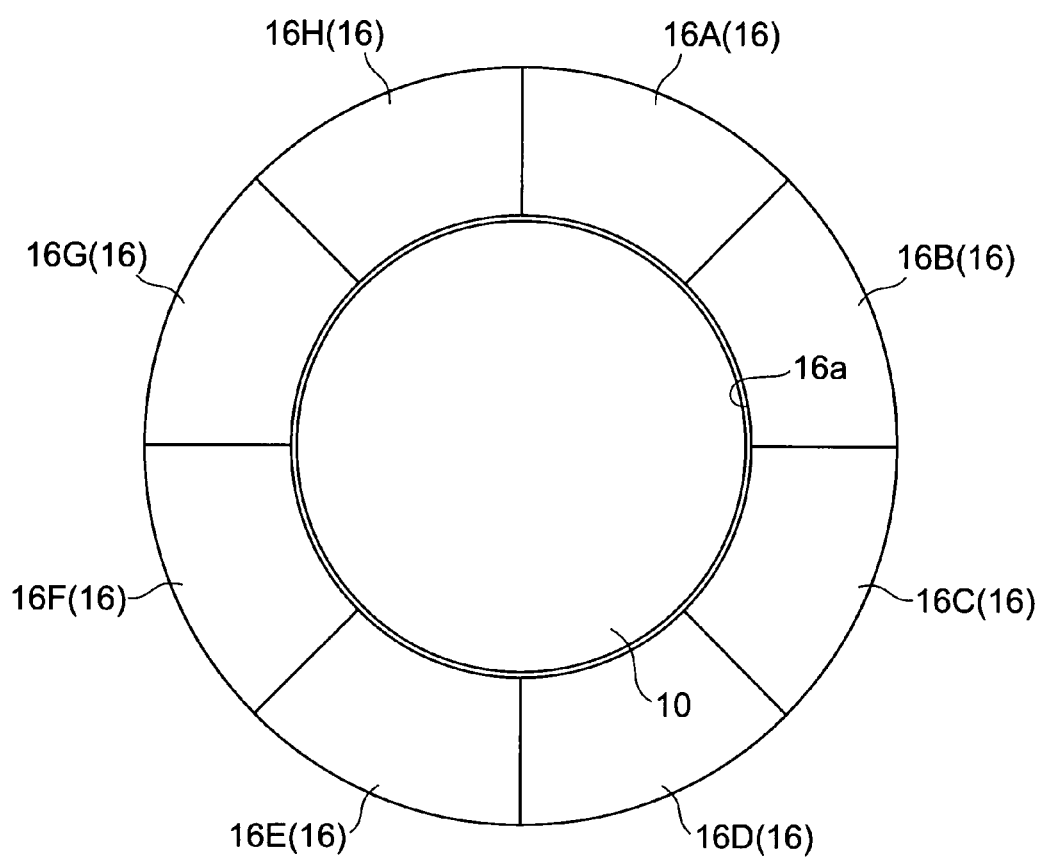
FIG. 4 is a vertical sectional view showing the resist pattern processing apparatus in accordance with still another embodiment.

The annular member 16 may be constructed by combining a plurality of components 16A to 16H as shown in FIG. 4.

A test for verifying whether the linewidth of the photoresist R patterned on the substrate 10 was slimmed evenly with a high precision in the resist pattern processing apparatus 1 in accordance with the present invention was conducted under the following conditions of Example 1 and Comparative Example 1.

EXAMPLE 1

In Example 1, using the resist pattern processing apparatus 1 equipped with the annular member 16 surrounding the whole periphery of the substrate 10 as shown in FIG. 1 and FIG. 2, the photoresist R on the substrate 10 was irradiated for 3 minutes with UV rays by the UV lamps 14c, so as to slim the linewidth of a resist pattern. Here, used as the substrate 10 was one having a diameter of 6 inches, the distance D1 between the lower face of the glass plate 14b of the UV-emitting part 14 and the surface of the substrate 10 and the distance D2 between the lower face of the glass plate 14b of the UV-emitting part 14 in the surroundings of the substrate 10 and the surface of the annular member 16 were each set to 2 mm, the distance G between the side face of the substrate 10 and the inner peripheral face of the opening 16a of the annular member 16 was set to 1 mm, the thickness T1 of the annular member 16 and the thickness T2 of the substrate 10 were each set to 2 mm, the width L of the annular member was set to 50 mm, the wavelength of the UV lamps 14c was set to 172 nm, and the illuminance of the UV lamps 14c was set to 10 mW. The resist pattern on the substrate 10 was obtained by applying a positive resist for KrF excimer laser light sources (AZ-5105P manufactured by AZ Electronic Materials) onto the substrate 10, exposing it to light by a KrF excimer laser stepper (NSR-2205EX14 manufactured by Nikon Corp.) so as to yield a predetermined pattern, and then developing it.

COMPARATIVE EXAMPLE 1

The linewidth of a resist pattern was slimmed as in Example 1 except that a resist pattern processing apparatus without the annular member 16 was used.

(Evaluation Results)

The linewidth was measured in each of the resist patterns slimmed in Example 1 and Comparative Example 1. Forty measurement points were evenly arranged on the surface of the substrate 10. FIG. 5 shows the results. As shown in FIG. 5, Example 1 yielded the maximum linewidth of 52.1 nm, the minimum linewidth of 48.5 nm, the difference between the maximum and minimum of 3.6 nm, the average value of 49.9 nm, and the 3σ (three times the standard deviation) of 3.0 nm. On the other hand, Comparative Example 1 yielded the maximum linewidth of 53.8 nm, the minimum linewidth of 43.5 nm, the difference between the maximum and minimum of 10.3 nm, the average value of 49.2 nm, and the 3σ of 8.4 nm. The foregoing verifies that, as compared with Comparative Example 1, Example 1 yields less fluctuation in the linewidth of the resist pattern and thus can slim the linewidth of the photoresist R patterned on the substrate 10 evenly with a high precision.

It is apparent that various embodiments and modifications of the present invention can be embodied, based on the above description. Accordingly, it is possible to carry out the present invention in the other modes than the above best mode, within the following scope of claims and the scope of equivalents.

What is claimed is:

1. A resist pattern processing apparatus comprising:
   a stage for mounting a substrate having a patterned photoresist arranged on a surface thereof;
   a UV-emitting device for emitting a UV ray to the stage; and
   an annular member for surrounding an entire periphery of the substrate, the annular member having a thickness and a width selected to ensure a substantially even ozone concentration on a surface of the substrate by sufficiently restraining ozone from diffusing to a periphery of the stage, and being formed from a material that does not transmit ozone therethrough, the material comprising at least one of stainless steel, iron, Cu, Ti, Mo, Cr, Al, and Si,
   wherein the UV-emitting device comprises a housing having an opening facing the stage, a UV-transmitting member arranged to close the opening, and a UV lamp arranged in a space formed by the housing and the UV-transmitting member, and
   a gap between the inner peripheral face of the annular member and a side face of the substrate is smaller than the smaller of (1) a thickness of the substrate and (2) a distance between the UV-transmitting member and the substrate.

2. A resist pattern processing apparatus according to claim 1, wherein the thickness of the annular member is at least ½ the thickness of the substrate.

3. A resist pattern processing apparatus according to claim 2, wherein the thickness of the annular member is substantially the same as the thickness of the substrate.

4. A resist pattern processing apparatus according to claim 1, wherein the width is defined as a shortest distance between the outer and inner peripheral faces of the annular member and is at least 20 mm.

5. A resist pattern processing method comprising:
   a mounting step of mounting a substrate having a patterned photoresist arranged on a surface thereof onto a stage such that an annular member is positioned at an entire periphery of the substrate, the annular member having a thickness and a width selected to ensure a substantially even ozone concentration on the surface of the substrate by sufficiently restraining ozone from diffusing to a periphery of the stage, and the annular member being formed from a material that does not transmit ozone therethrough, the material comprising at least one of stainless steel, iron, Cu, Ti, Mo, Cr, Al, and Si; and
   an irradiation step of causing a UV-emitting device to emit a UV ray to the surface of the substrate mounted on the stage, the UV ray slimming the photoresist, the UV-emitting device being configured and positioned relative to the substrate such that during the irradiation step, oxygen in air between the substrate and the UV-emitting device forms ozone that is supplied to the photoresist,
   wherein the ozone formed during the irradiation step is a primary ozone supply to the photoresist during resist pattern processing.

6. A resist pattern processing method according to claim 5, wherein the thickness of the annular member is at least ½ the thickness of the substrate.

7. A resist pattern processing method according to claim 6, wherein the thickness of the annular member is substantially the same as the thickness of the substrate.

8. A resist pattern processing method according to claim 5, wherein the width is defined as a shortest distance between the outer and inner peripheral faces of the annular member and is at least 20 mm.

9. A resist pattern processing method according to claim 5, wherein the UV-emitting device comprises a housing having an opening facing the stage, a UV-transmitting member arranged to close the opening, and a UV lamp arranged in a space formed by the housing and the UV-transmitting member; and
   wherein a gap between an inner peripheral face of the annular member and a side face of the substrate is smaller than a smaller of (1) the thickness of the substrate and (2) a distance between the UV-transmitting member and the substrate.

10. A resist pattern processing method according to claim 5, wherein the annular member is separate from the stage; and
    wherein the mounting step mounts the substrate onto the stage after mounting the annular member onto the stage.

11. A resist pattern processing method according to claim 5, wherein the annular member is separate from the stage; and
    wherein the mounting step mounts the substrate onto the stage before mounting the annular member onto the stage.

* * * * *